United States Patent [19]
Yamauchi et al.

[11] Patent Number: 5,962,889
[45] Date of Patent: Oct. 5, 1999

[54] NONVOLATILE SEMICONDUCTOR MEMORY WITH A FLOATING GATE THAT HAS A BOTTOM SURFACE THAT IS SMALLER THAN THE UPPER SURFACE

[75] Inventors: Yoshimitsu Yamauchi, Nabari; Masanori Yoshimi; Shinichi Sato, both of Nara; Keizo Sakiyama, Kashihara, all of Japan

[73] Assignee: Sharp Kabushiki Kaisha, Osaka, Japan

[21] Appl. No.: 08/690,621

[22] Filed: Jul. 31, 1996

[30] Foreign Application Priority Data

Jul. 31, 1995 [JP] Japan .................................. 7-194782
Jan. 31, 1996 [JP] Japan .................................. 8-015075

[51] Int. Cl.$^6$ .................................................. H01L 29/788
[52] U.S. Cl. ............................. 257/317; 257/321
[58] Field of Search ................................. 257/316, 317, 257/321, 381, 756

[56] References Cited

U.S. PATENT DOCUMENTS

| | | | |
|---|---|---|---|
| 4,115,914 | 9/1978 | Harari | 257/321 |
| 4,939,690 | 7/1990 | Momodomi et al. | 365/185 |
| 4,945,068 | 7/1990 | Sugaya . | |
| 4,989,054 | 1/1991 | Arima et al. | 257/316 |
| 5,019,879 | 5/1991 | Chiu | 257/321 |
| 5,021,848 | 6/1991 | Chiu | 257/321 |
| 5,140,551 | 8/1992 | Chiu | 365/185 |
| 5,273,923 | 12/1993 | Ko-Min et al. | 437/43 |
| 5,283,758 | 2/1994 | Nakayama et al. | 365/185 |
| 5,379,254 | 1/1995 | Chang | 365/185 |
| 5,471,080 | 11/1995 | Satoh et al. | 257/756 |
| 5,516,713 | 5/1996 | Chen-Chiu et al. | 437/43 |
| 5,521,110 | 5/1996 | Manzur | 437/43 |
| 5,569,946 | 10/1996 | Hong | 257/316 |
| 5,621,233 | 4/1997 | Sharma et al. | 257/316 |
| 5,637,897 | 6/1997 | Oyama | 257/321 |
| 5,675,162 | 10/1997 | Hong | 257/316 |

FOREIGN PATENT DOCUMENTS

| | | |
|---|---|---|
| 0364769A2 | 4/1990 | European Pat. Off. . |
| 0419663 A1 | 4/1991 | European Pat. Off. . |
| 0535694 | 4/1993 | European Pat. Off. . |
| 3844115 A1 | 7/1989 | Germany . |

(List continued on next page.)

OTHER PUBLICATIONS

Yoshikawa et al., "An Asymmetrical Lightly Doped source Cell For Virtual Ground High–Density Eprom's", IEEE Transactions on Electron Devices, vol. 37, No. 4, Apr. 1, 1990, pp. 1046–1051, XP000125218.

Ohi et al., "An Asymmetrical Offset Source/Drain Structure For Virtual Ground Array Flash Memory with Dinor Operation", Digest of Technical Papers of the Symposium on VLSI Technology, Kyoto, May 17–19, 1993, No. –, May 17, 1993, Institute of Electrical and Electronics Engineers, pp. 57/58, XP000462904.

Hisamune et al, IEDM 93, "A High Capacitive–Coupling Ratio (HiCR) Cell for 3 V–Only 64 Mbit and Future Flash Memories", pp. 19–22, 1993.

Kato et al, IDEM 94, "A 0.4–$\mu m^2$ Self–Aligned Contactless Memory Cell Technology Suitable for 256–Mbit Flash Memories", 1994, pp. 921–923.

*Primary Examiner*—David B. Hardy
*Attorney, Agent, or Firm*—Nixon & Vanderhye P.C.

[57] ABSTRACT

In the nonvolatile semiconductor memory including a memory cell array having memory cells arranged in a matrix of the present invention, the memory cell array includes: a semiconductor substrate; a tunnel oxide film formed on the semiconductor substrate; floating gates formed on the tunnel oxide film; first insulating films formed on the floating gates; and control gates formed on the first insulating films, wherein each of the floating gates includes a first polysilicon film and second polysilicon films, the second polysilicon films being formed on both sides of the first polysilicon film, second insulating films are formed on the tunnel oxide film between the first polysilicon films, the second insulating films having a predetermined thickness which is thinner than that of the first polysilicon films, and the second polysilicon films are formed on the second insulating films.

10 Claims, 13 Drawing Sheets

FOREIGN PATENT DOCUMENTS

| | | |
|---|---|---|
| 0256993 | 2/1988 | Japan . |
| 025993 | 2/1988 | Japan . |
| 63-131575 | 6/1988 | Japan ................................... 257/756 |
| 2-2685 | 1/1990 | Japan . |
| 2-87578 | 3/1990 | Japan . |
| 2-231772 | 9/1990 | Japan . |
| 4-130778 | 5/1992 | Japan . |
| 4-208573 | 7/1992 | Japan . |
| 7-183407 | 7/1995 | Japan . |
| 2073488 | 10/1981 | United Kingdom . |

PRIOR ART

| Operation mode | Word line voltage (V) | | Bit line voltage (V) | | | |
|---|---|---|---|---|---|---|
| | Selected | Non-selected | | | | |
| | WL1 | WL2 | BL1 | BL2 | BL3 | BL4 |
| Write | VH1 | 0 | Float | Vcc | Float | Float |
| Erase | VH2 | VH2 or 0 | 0 | 0 | 0 | 0 |
| Read | Vcc | 0 | VL | VL | 0 | 0 |

FIG.11

| Operation mode | Word line voltage (V) | | Bit line voltage (V) | | | |
|---|---|---|---|---|---|---|
| | Selected | Non-selected | | | | |
| | WL1 | WL2 | BL1 | BL2 | BL3 | BL4 |
| Write | VH1 | 0 | Vcc | Vcc | 0 | 0 |
| Erase | −VH2 | −VH2 or 0 | Vcc | Vcc | Vcc | Vcc |
| Read | Vcc | 0 | VL | VL | 0 | 0 | ns # NONVOLATILE SEMICONDUCTOR MEMORY WITH A FLOATING GATE THAT HAS A BOTTOM SURFACE THAT IS SMALLER THAN THE UPPER SURFACE

RELATED APPLICATIONS

This application is related to commonly assigned copending application Ser. No. 08/672,666 filed Jun. 28, 1996.

BACKGROUND OF THE INVENTION

1. Field of the Invention

The present invention relates to a nonvolatile semiconductor memory having floating gates and a method for fabricating such a nonvolatile semiconductor memory.

2. Description of the Related Art

A method for fabricating a conventional flash memory will be described with reference to FIGS. 1A to 1C, 2A to 2C, and 3A to 3C. FIG. 1A is a plan view illustrating a first step of the fabrication process of a conventional flash memory, and FIGS. 1B and 1C are sectional views taken along lines B—B and C—C of FIG. 1A, respectively. FIG. 2A is a plan view illustrating a second step of the fabrication process of the flash memory, and FIGS. 2B and 2C are sectional views taken along lines B—B and C—C of FIG. 2A, respectively. FIG. 3A is a plan view illustrating a third step of the fabrication process of the flash memory, and FIGS. 3B and 3C are sectional views taken along lines B—B and C—C of FIG. 3A, respectively.

First, referring to FIGS. 1A to 1C, local oxidation of silicon (LOCOS) oxide films 33 are formed on a semiconductor substrate 21 of a memory cell array 500. The portions of the semiconductor substrate 21 which are not covered with the LOCOS oxide films 33 will remain active regions 34.

Referring to FIGS. 2A to 2C, tunnel oxide films 22 are formed on the active regions 34 of the semiconductor substrate 21, and polysilicon films which are to be floating gates 23 are formed on the tunnel oxide films 22 so as to cover the entire active regions 34. The LOCOS oxide films 33 are ten times or more thicker than the tunnel oxide films 22 and are used as isolators. As shown in FIG. 2C, the floating gates 23 are formed so as to overlap the periphery portions of the LOCOS oxide films 33. Thus, the top surface area of each floating gate 23 is larger than the area thereof in contact with the tunnel oxide film 22. This structure makes it possible to obtain a coupling capacitance $C_2$ between the floating gate and a control gate larger than a coupling capacitance $C_1$ between the floating gate and the semiconductor substrate without increasing the coupling capacitance $C_1$.

Next, referring to FIGS. 3A to 3C, ONO ($SiO_2/SiN/SiO_2$) films 29 are formed to cover the floating gates 23 and a material for the control gates is deposited on the resultant substrate. A resist having a pattern of the control gates (word lines) is formed on the deposited material. Using this resist pattern as a mask, the material for the control gates and the ONO films 29 are etched to form control gates 30 as well as the floating gates 23. Thereafter, ions are implanted in the semiconductor substrate 21 using the control gates 30 as a mask, to form source diffusion layers 25a and drain diffusion layers 25b.

In the conventional nonvolatile semiconductor memory 500 shown in FIGS. 1A to 1C, 2A to 2B, and 3A to 3C with the above-described structure, in order to reduce the potential difference $V_{FG}$ between the floating gate 23 and the semiconductor substrate 21, it is necessary to increase the coupling ratio $C_2/C_1$, i.e., the ratio of the coupling capacitance $C_2$ between the floating gate 23 and the control gate 30 to the coupling capacitance $C_1$ between the floating gate 23 and the semiconductor substrate 21. At this time, when a voltage $V_{CG}$ is applied to the control gate 30 and 0 V is applied to the semiconductor substrate 21, the potential difference $V_{FG}$ between the floating gate 23 and the semiconductor substrate 21 is represented by:

$$V_{FG}=V_{CG} \cdot C_2/(C_1+C_2).$$

As described above, the floating gates 23 extend so as to overlap the LOCOS films 33 in order to increase the coupling ratio. This causes a problem of increasing the cell area.

Impurity diffusion layers may be used as isolators in place of the thick insulating films. In such a case, however, the coupling capacitance $C_2$ between the floating gate and the control gate cannot be made larger than the coupling capacitance $C_1$ between the floating gate and the semiconductor substrate by overlapping the floating gate with the impurity diffusion layers. It is therefore difficult to increase the coupling ratio in this case, unlike the case where the thick insulating films are used as isolators.

SUMMARY OF THE INVENTION

The nonvolatile semiconductor memory of this invention, includes a memory cell array having memory cells arranged in a matrix, the memory cell array comprising: a semiconductor substrate; a tunnel oxide film formed on the semiconductor substrate; floating gates including first polysilicon films formed on the tunnel oxide film and second polysilicon films formed on both sides of the respective first polysilicon films; first insulating films formed on the floating gates; and control gates formed on the first insulating films, wherein the memory cell array further comprising second insulating films formed on the tunnel oxide film between the first polysilicon films, the second insulating films having a predetermined thickness which is thinner than that of the first polysilicon films, and wherein the second polysilicon films are formed on the second insulating films.

The nonvolatile semiconductor memory according to the present invention includes a memory cell array having memory cells arranged in a matrix, the memory cell array comprising: a semiconductor substrate; a tunnel oxide film formed on the semiconductor substrate; floating gates including a first polysilicon film formed on the tunnel oxide film and a third polysilicon film formed on the first polysilicon film; first insulating films formed on the floating gates; and control gates formed on the first insulating films, wherein the memory cell array further comprising second insulating films formed on the tunnel oxide film between the first polysilicon films, the second insulating films having a thickness which is substantially same as that of the first polysilicon films, whereby a surface including surfaces of the first polysilicon films and surfaces of the second insulating films being planarized, and wherein each of the third polysilicon film covering the corresponding first polysilicon film and portions of the second insulating films, a surface area of the third polysilicon film being larger than that of the first polysilicon film.

In one embodiment of the present invention, the second insulating films prevent capacitive coupling between the corresponding second polysilicon films of the floating gates and the semiconductor substrate.

The method of the present invention is a method for fabricating a nonvolatile semiconductor memory including a memory cell array having memory cells arranged in a matrix, the memory cell array including a tunnel oxide film, floating gates, first insulating films, and control gates formed in this order on a semiconductor substrate. The method comprising the steps of: forming the tunnel oxide film on the semiconductor substrate; depositing first polysilicon on the tunnel oxide film and patterning the first polysilicon into a desired shape by photolithography to form first polysilicon films; depositing second insulating material on the entire surface of the resultant substrate and etching back the deposited second insulating material to form second insulating films on the tunnel oxide film between the first polysilicon films, the second insulating films having a predetermined thickness which is thinner than that of the first polysilicon films; and depositing second polysilicon on the entire surface of the resultant substrate and etching back the second polysilicon to form second polysilicon films on both sides of the first polysilicon films, wherein each of the first polysilicon films and the corresponding second polysilicon films constitute the floating gates.

The method of the present invention is a method for fabricating a nonvolatile semiconductor memory including a memory cell array having memory cells arranged in a matrix, the memory cell array including a tunnel oxide film, floating gates, first insulating films, and control gates formed in this order on a semiconductor substrate. The method comprising the steps of: forming the tunnel oxide film on the semiconductor substrate; depositing first polysilicon on the tunnel oxide film and patterning the first polysilicon into a desired shape by photolithography to form first polysilicon films; depositing second insulating material on the entire surface of the resultant substrate and removing the second insulating material until the first polysilicon films are exposed, to form second insulating films, and planarizing a surface including surfaces of the first polysilicon films and surfaces of the second insulating films; and depositing third polysilicon on the entire surface of the resultant substrate and patterning the third polysilicon to form third polysilicon films, each of the third polysilicon films covering the corresponding first polysilicon film, a surface area of each third polysilicon film being larger than that of the corresponding first polysilicon films, wherein the first polysilicon films and the corresponding third polysilicon films constitute the respective floating gates.

In one embodiment of the present invention, after the formation of the control gates, the method further comprises a step of forming impurity diffusion regions as isolators by implanting impurities of a same conductivity type as that of the semiconductor substrate in the semiconductor substrate using the control gates as a mask.

In one embodiment of the present invention, the method further comprises a step of forming source/drain diffusion layers by implanting impurities in the semiconductor substrate using the pattern of the first polysilicon films as a mask.

Thus, according to the present invention, each floating gate includes the first polysilicon film and either the second polysilicon films or the third polysilicon film. An insulating film with a predetermined thickness is formed between the semiconductor substrate and the second or third polysilicon film. As a result, while the coupling capacitance between the floating gate and the semiconductor substrate is dependent on only the first polysilicon film, the surface area of the floating gate is determined by an area including the first polysilicon film and either the second polysilicon films or the third polysilicon film. This makes it possible to increase the capacitance coupling ratio of the control gate compared with that conventionally obtained for the same cell area. This eliminates or reduces the necessity of overlapping the floating gate with the isolation regions in the channel width direction.

Moreover, the second polysilicon films are formed in the narrow spaces between sections of the first polysilicon films having a minimum width in the channel length direction. Therefore, the formation of the second polysilicon films does not increase the cell area.

Thus, the invention described herein makes possible the advantages of (1) providing a nonvolatile semiconductor memory where the coupling ratio can be increased without increasing the cell area even when impurity diffusion regions are used as isolators in place of thick insulating isolators, and (2) providing a method for fabricating such a nonvolatile semiconductor memory.

These and other advantages of the present invention will become apparent to those skilled in the art upon reading and understanding the following detailed description with reference to the accompanying figures.

BRIEF DESCRIPTION OF THE DRAWINGS

FIG. 11 is a table showing the conditions in the write, erase, and read operations in Example 2.

DESCRIPTION OF THE PREFERRED EMBODIMENTS

The present invention will be described by way of examples with reference to the accompanied drawings.

First, the configuration of a flash memory of a virtual ground architecture will be described.

Figure 1A:
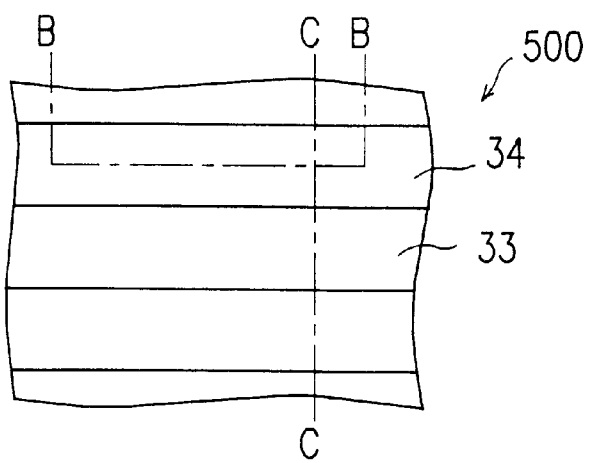
FIG. 1A is a plan view illustrating a first step of the fabrication process of a conventional flash memory.
Figure 1B:
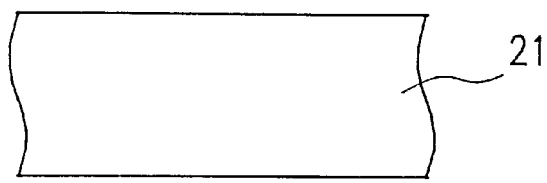
FIGS. 1B and 1C are sectional views taken along lines B—B and C—C of FIG. 1A, respectively.
Figure 1C:
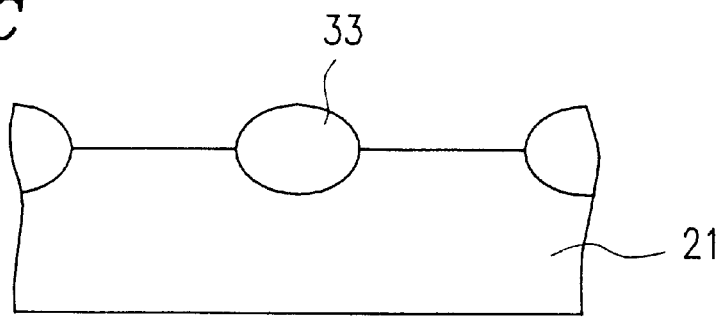
Figure 2A:
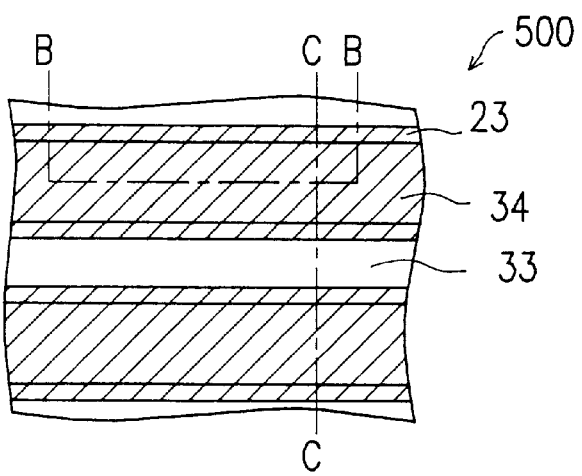
FIG. 2A is a plan view illustrating a second step of the fabrication process of the conventional flash memory.
Figure 2B:
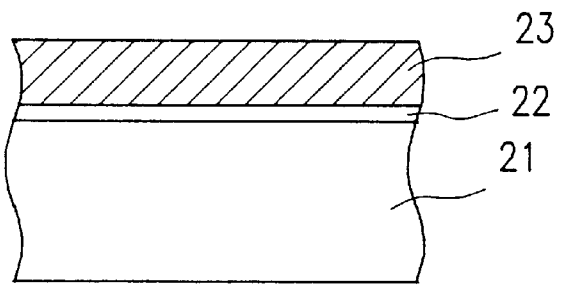
FIGS. 2B and 2C are sectional views taken along lines B—B and C—C of FIG. 2A, respectively.
Figure 2C:
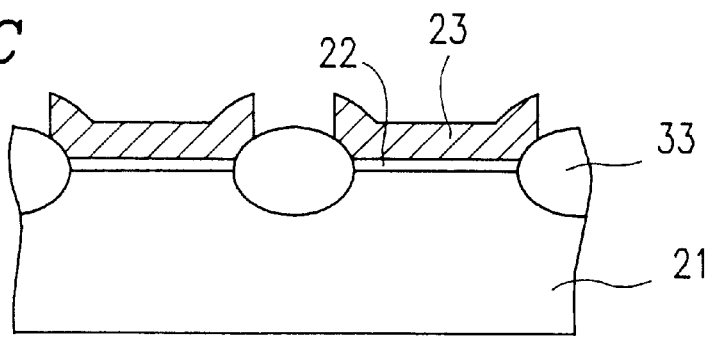
Figure 3A:
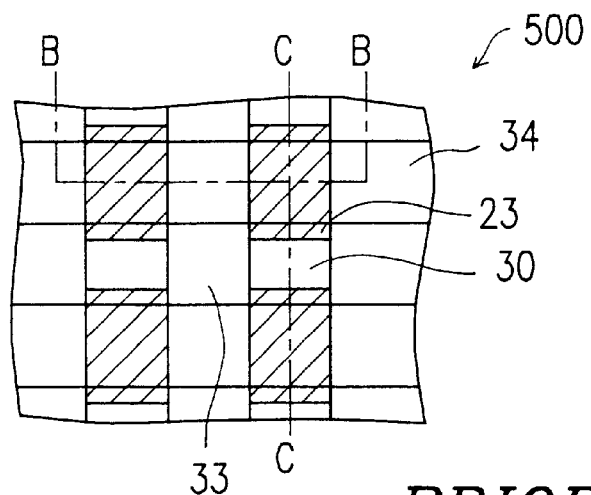
FIG. 3A is a plan view illustrating a third step of the fabrication process of the conventional flash memory.
Figure 3B:
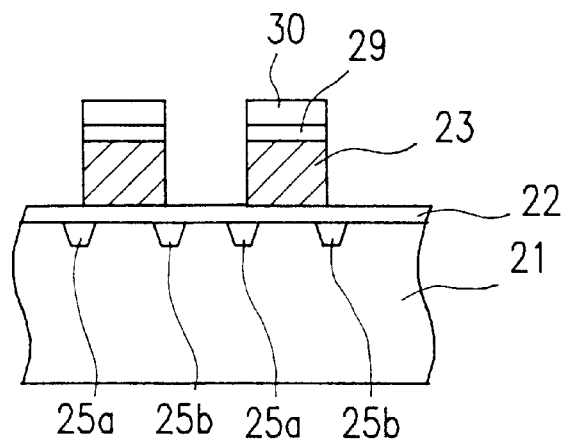
FIGS. 3B and 3C are sectional views taken along lines B—B and C—C of FIG. 3A, respectively.
Figure 3C:
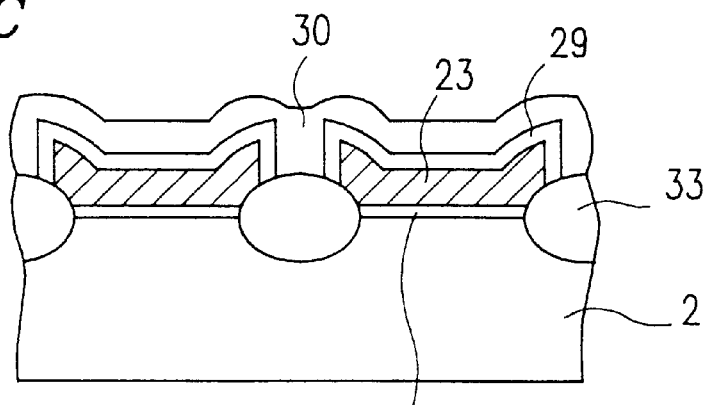
Figure 4A:
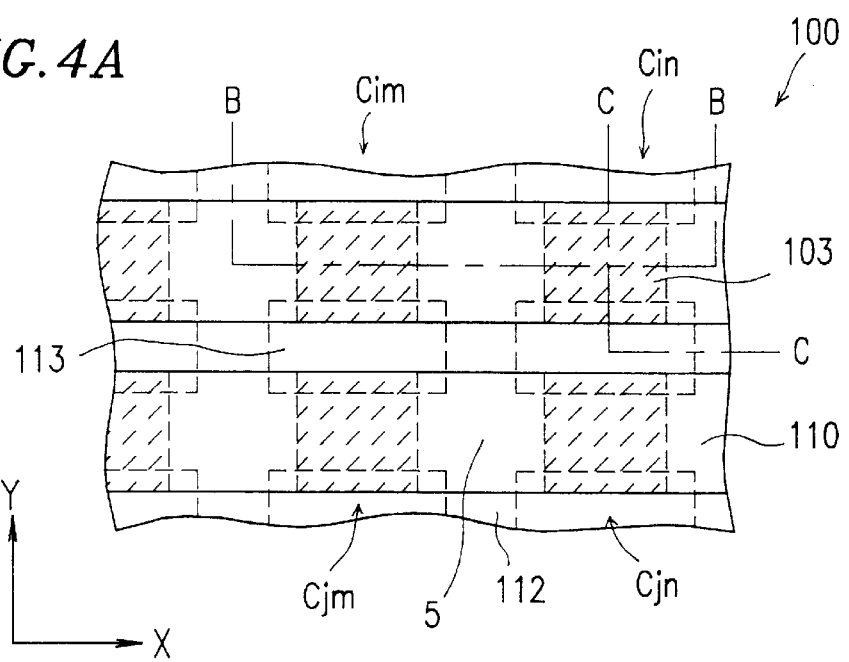
FIG. 4A is a plan view illustrating a flash memory of a virtual ground architecture.
Figure 4B:
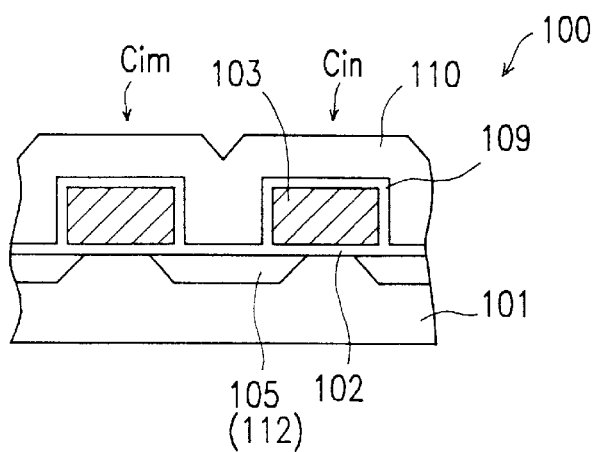
FIGS. 4B and 4C are sectional views taken along lines B—B and C—C of FIG. 4A, respectively.
Figure 4C:
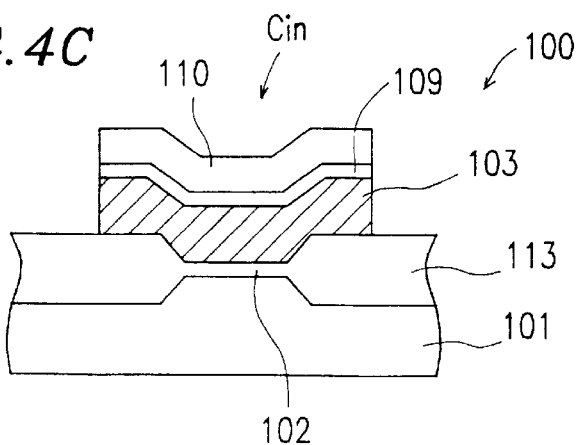

In the following examples, a nonvolatile semiconductor memory of a virtual ground architecture is used where source lines (ground lines) and drain lines are not fixed but switched appropriately therebetween. As an example of the memory of the virtual ground architecture, the configuration shown in FIGS. 4A to 4C has been proposed. FIG. 4A is a plan view of a memory cell array 100 of a flash memory of the virtual ground architecture. FIGS. 4B and 4C are sectional views taken along lines B—B and C—C of FIG. 4A, respectively.

Referring to FIGS. 4A to 4C, the memory cell array 100 includes a plurality of memory cells C formed in a matrix on a semiconductor substrate 101. In FIGS. 4A to 4C, the respective memory cells C are denoted by individual codes such as $C_{im}$. Each of the memory cells C includes a tunnel insulating film 102 formed on the semiconductor substrate 1, and a floating gate 103 formed on the tunnel insulating film 102.

A control gate 110 is formed on the floating gate 103 via an insulating film 109 made of ONO ($SiO_2/SiN/SiO_2$) and the like. Such control gates 110 extend in a channel direction of the memory cell C (an X direction shown in FIG. 4A), constituting a word line for connecting the memory cells C lined in the X direction.

As shown in FIG. 4B, an impurity diffusion layer 105 is formed between every two memory cells adjacent each other in the X direction (e.g., memory cells $C_{im}$ and $c_{in}$). The impurity diffusion layer 105 serves as a drain diffusion layer for one of the two adjacent memory cells (e.g., the memory cell $C_{im}$) and a source diffusion layer for the other memory cell (e.g., the memory cell $C_{in}$). The impurity diffusion layer 105 is thus shared by the two adjacent memory cells.

The impurity diffusion layers 105 lined in the Y direction are connected with one another via diffusion layer wirings, forming a so-called buried bit line 112, as shown in FIG. 4A. The bit line 112 serves as a source line or a drain line depending on the memory cell selected.

Thus, in the virtual ground architecture, the impurity diffusion layer 105 is shared by two memory cells adjacent in the X direction, the impurity diffusion layer 105 acting as the source diffusion layer for one memory cell and the drain diffusion layer for the other memory cell. This eliminates the necessity of isolating the source diffusion layer and the drain diffusion layer of memory cells adjacent in the X direction. The bit line 112 can be formed by connecting the impurity diffusion layers 105 for the memory cells lined in the Y direction. This eliminates the necessity of forming a contact region for connecting the bit line with each memory cell, allowing the memory cell array 100 to achieve a high degree of integration.

As shown in FIGS. 4A and 4C, a field oxide film (element isolation film) 113 such as a LOCOS oxide film is formed between two memory cells adjacent in the Y direction (e.g., the memory cells $C_{in}$ and $C_{jn}$).

Other types of memory cell arrays other than the virtual ground architecture can also be used as long as there is formed an insulating film of a predetermined thickness which blocks the generation of a capacitance between a second polysilicon film and a floating gate according to the present invention and the semiconductor substrate.

EXAMPLE 1

Figure 5A:
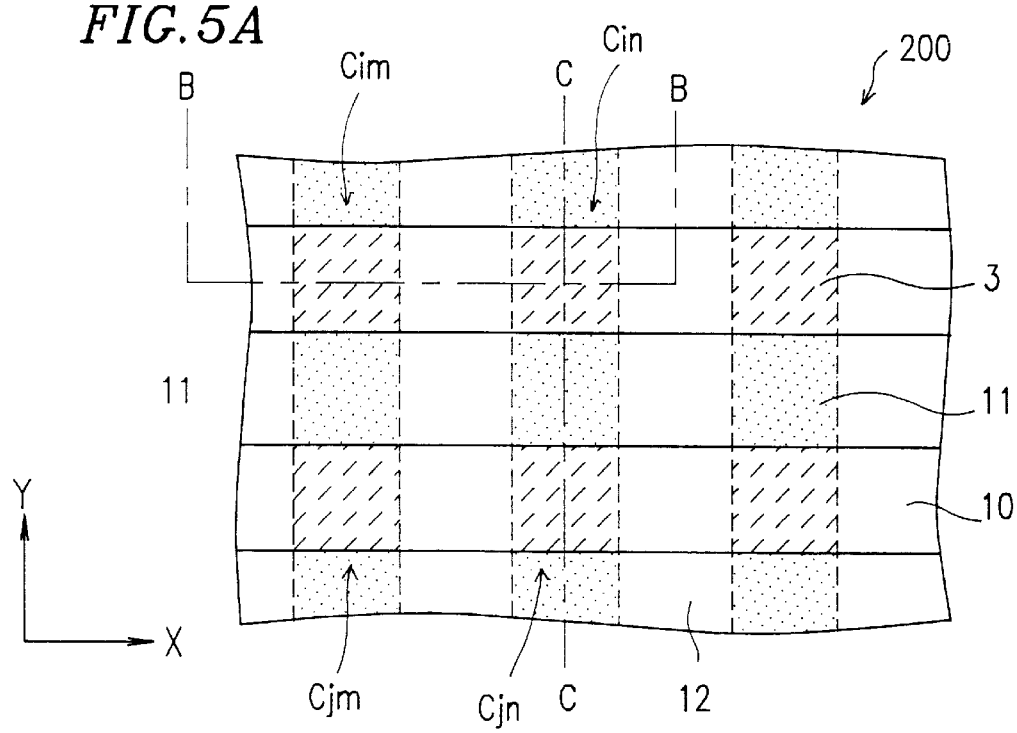
FIG. 5A is a plan view illustrating a nonvolatile semiconductor memory of Example 1 according to the present invention.
Figure 5B:
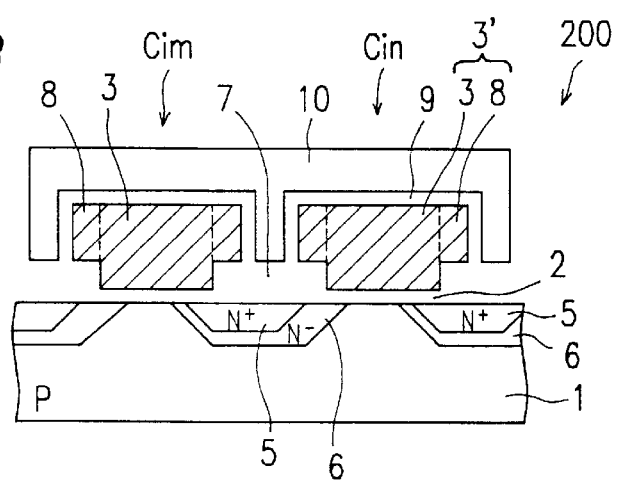
FIGS. 5B and 5C are sectional views taken along lines B—B and C—C of FIG. 5A, respectively.
Figure 5C:
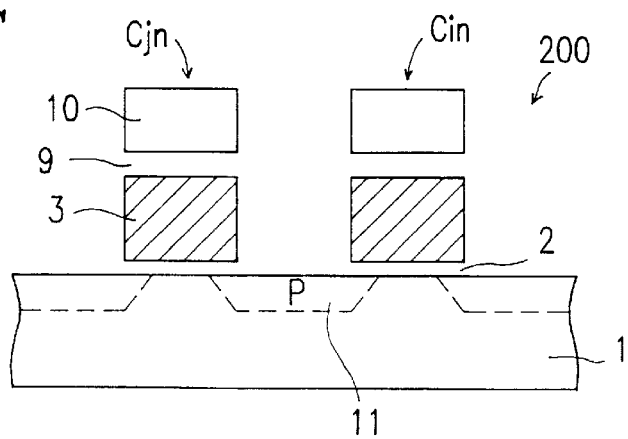

FIG. 5A is a plan view of a memory cell array 200 of the nonvolatile semiconductor memory of Example 1 according to the present invention. FIGS. 5B and 5C are sectional views taken along lines B—B and C—C of FIG. 5A, respectively. In FIGS. 5A to 5C, the same components are denoted by the same reference numerals as those in FIGS. 4A to 4C.

Referring to FIGS. 5A to 5C, the memory cell array 200 of this example includes a p-type semiconductor substrate 1, a tunnel insulating film 2 formed on the semiconductor substrate 1, first polysilicon films 3 formed on the semiconductor substrate 1 formed on the tunnel insulating film 2, and second polysilicon films 8. The first and second polysilicon films 3 and 8 constitute floating gates 3'.

An ONO film 9 covers each of the floating gates 3' composed of the first and second polysilicon films 3 and 8, and a control gate 10 is formed over the ONO film 9. As shown in FIG. 5A, the control gates 10 are formed on all memory cells lined in the X direction and are electrically connected, forming a word line.

A high-density impurity diffusion layer ($N^+$) 5 and a low-density impurity diffusion layer ($N^-$) 6 are formed between every two memory cells adjacent in the X direction, and these diffusion layers for the memory cells aligned in the Y direction are connected to form a bit line 12.

The first polysilicon film 3 of each memory cell capacitively couples with the high-density impurity diffusion layer 5 on the drain side via the tunnel insulating film 2, while the first polysilicon film 3 capacitively couples with the low-density impurity diffusion layer 6 on the source side via the tunnel insulating film 2, forming an asymmetric source/drain structure. The tunnel insulating film 2 may be a silicon oxide film or a double-layer structure of a silicon oxide film and a silicon nitride film.

As shown in FIG. 5C, an isolating layer 11 such as a p-type impurity diffusion layer is formed in the X direction between the memory cells.

Figures 6, 7:
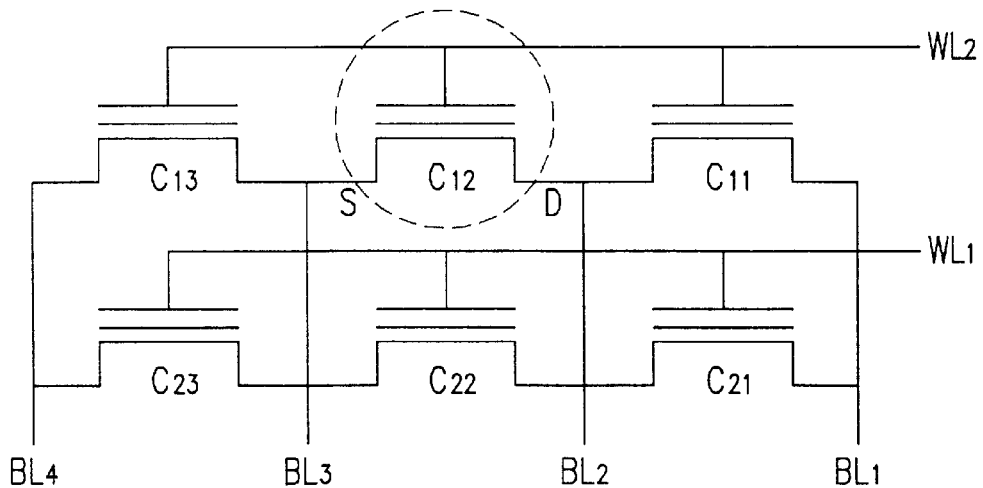
FIG. 6 is an equivalent circuit diagram of the nonvolatile semiconductor memory of the virtual ground architecture.
FIG. 7 is a table showing the conditions in the write, erase, and read operations in Example 1.

As shown in the equivalent circuit diagram of FIG. 6, the memory cell array 200 employs the virtual ground method, where bit lines BL (bit lines $BL_1$ to $BL_4$ are shown in FIG. 6) serve as source wirings or drain wirings depending on the selected cell.

The operation of the memory cell array 200 will now be described. FIG. 7 shows the operation conditions when the memory cell $C_{12}$ shown in FIG. 6 is selected, for example.

Referring to FIGS. 6 and 7, in the write operation, a negative high voltage $VH_1$ (−8 V, for example) is applied to a word line $WL_1$ connected to the selected cell $C_{12}$, while 0 V is applied to the other word lines ($WL_2$, for example). A predetermined positive source voltage $V_{cc}$ (4 V, for example) is applied to a bit line $BL_2$ connected to a drain of the selected cell $C_{12}$, while the other bit lines ($BL_1$, $BL_3$, and $BL_4$, for example) are put in a floating state. As a result, a tunnel current flows in the selected cell $C_{12}$ via the tunnel insulating film 2 due to the electric field generated between the floating gate 3' and the drain (high-density impurity diffusion layer 5) thereof, allowing data to be written in the selected cell $C_{12}$. At this time, the source voltage $V_{cc}$ is also applied to the control gate 10 of the memory cell, for example, a memory cell $C_{11}$, which is not selected (hereinafter such a memory cell is referred to as a "non-selected cell") and which is connected to the bit line $BL_2$ on the source side. However, since the low-density impurity diffusion layer 6 which does not generate the tunnel phenomenon between the source (low-density impurity diffusion layer 6) and the floating gate is formed on the source side of the non-selected cell $C_{11}$, no tunnel current flows between the source and the floating gate 3' of the non-selected cell $C_{11}$, thereby inhibiting data from being written in the non-selected cell $C_{11}$.

In the erase operation, a positive high voltage $VH_2$ (12 V, for example) is applied to a desired word line, while 0 V is applied to all the bit lines, so as to erase a plurality of memory cells at one time. For example, when the voltage $VH_2$ is applied to the word line $WL_1$, data in the memory cells $C_{11}$, $C_{12}$, and $C_{13}$ are erased. When the voltage $VH_2$ is applied to the word line $WL_2$, data in the memory cells $C_{21}$, $C_{22}$, and $C_{23}$ are erased.

In the read operation, a predetermined voltage $V_{cc}$ (4 V, for example) is applied to the word line $WL_1$, while a predetermined voltage $V_L$ (1 V, for example) is applied to the bit line $BL_2$ and 0 V to the bit line $BL_3$, as in the conventional manner, so as to detect a current flowing between the bit lines $BL_2$ and $BL_3$. The voltages shown in the table of FIG. 7 have the relationship of $VH_1$, $VH_2 > V_{cc} > V_L$.

Next, the fabrication process of the memory cell array 200 of the nonvolatile semiconductor memory of this example will be described with reference to FIGS. 8A to 8G.

Figure 8A:
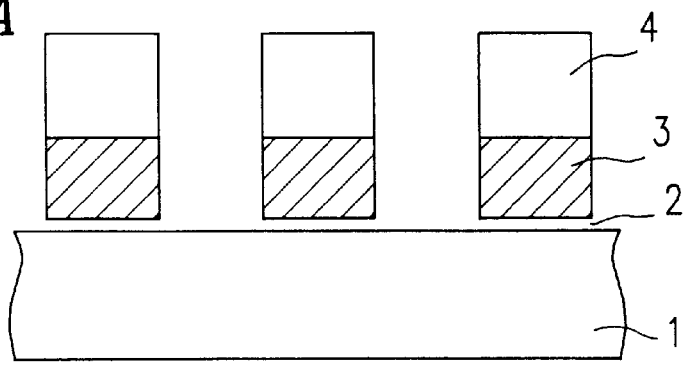
FIGS. 8A to 8G are sectional views illustrating the steps of the fabrication process of the nonvolatile semiconductor memory of Example 1.

First, the tunnel oxide film 2 with a thickness of about 8 nm is formed on the semiconductor substrate 1 by thermal oxidation. Then, first polysilicon is deposited on the entire surface of the resultant substrate to a thickness of about 100 to 200 nm. The resultant first polysilicon layer is patterned by photolithography using a photoresist 4 to form the first polysilicon films 3 which are to constitute the floating gates in the shape of stripes extending in the channel width direction (FIG. 8A).

Figure 8B:
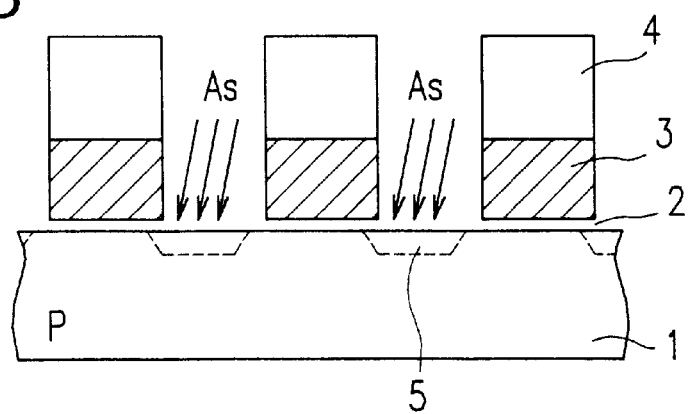

Thereafter, arsenic (As) ions are obliquely implanted in the semiconductor substrate 1 at an angle of 7° from the normal of the semiconductor substrate 1 under the conditions of an acceleration energy of 70 KeV and a dose amount of $1 \times 10^{15}/cm^2$ using the pattern of the photoresist 4 and the first polysilicon films 3 as a mask, so as to form the high-density impurity diffusion layers 5 which are to be the bit lines (FIG. 8B).

Figure 8C:
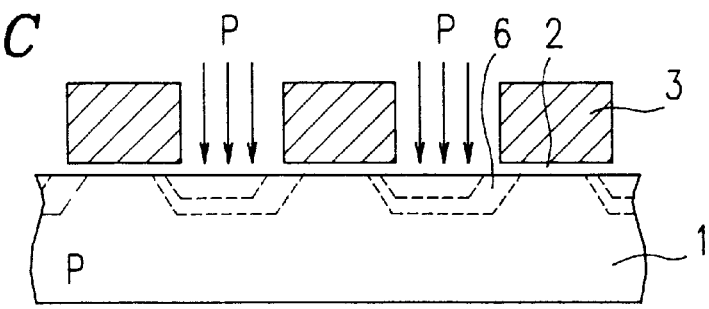
Figure 8D:
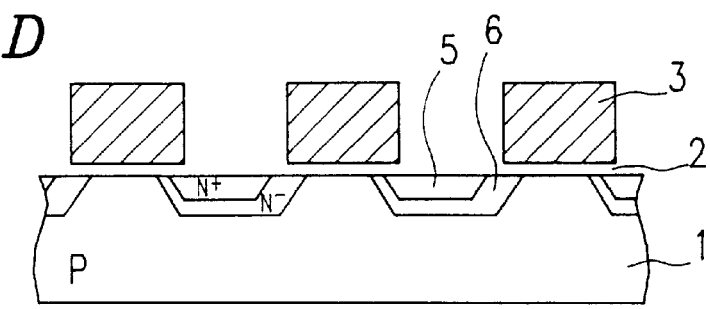

After the photoresist 4 is removed, phosphorus (P) ions are implanted in the semiconductor substrate 1 under the conditions of an acceleration energy of 50 KeV and a dose amount of $3 \times 10^{13}/cm^2$ using the pattern of the first polysilicon films 3 as a mask, so as to form the low-density impurity diffusion layers 6 (FIG. 8C). Thereafter, the resultant substrate is heat-treated in a nitrogen atmosphere at 900° C. for 10 minutes, so that the drain diffusion layers of a DDD structure and the source diffusion layers of an LDD structure are formed (FIG. 8D).

Figure 8E:
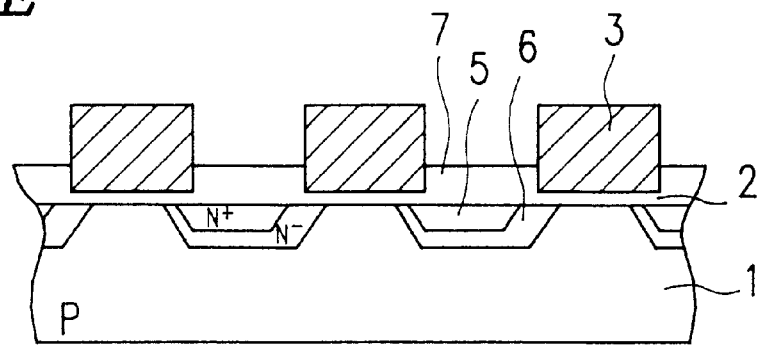

An insulating material is then deposited by chemical vapor deposition (CVD) to cover the first polysilicon films 3 and etched back, so that insulating films 7 with a thickness 5 to 10 times larger than that of the tunnel insulating film 2 are formed between the first polysilicon films 3. The insulating films 7 serve to prevent a coupling capacitance from generating between the second polysilicon films 8 (part of the floating gates) to be formed in a later stage and the semiconductor substrate 1. That is, portions where the relatively thick insulating films 7 are formed do not contribute the capacitive coupling of the floating gates 3' and the semiconductor substrate 1 (FIG. 8E).

Figure 8F:
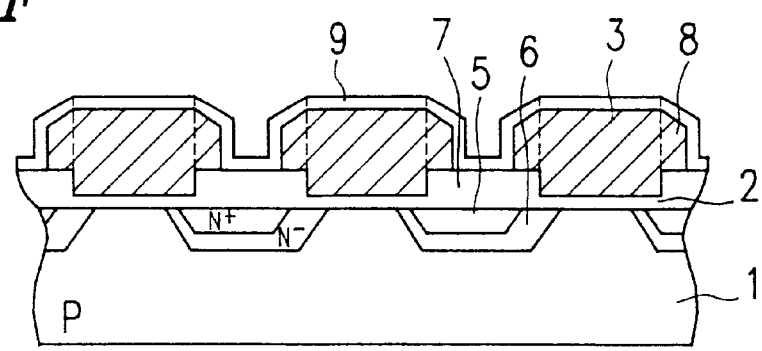

Next, a second polysilicon is deposited on the entire surface of the resultant substrate and etched back, so as to form second polysilicon films 8 on the sides of the first polysilicon films 3 in such a manner that they are electrically connected with each other. Thereafter, the ONO film 9 is formed on the resultant substrate (FIG. 8F).

Figure 8G:
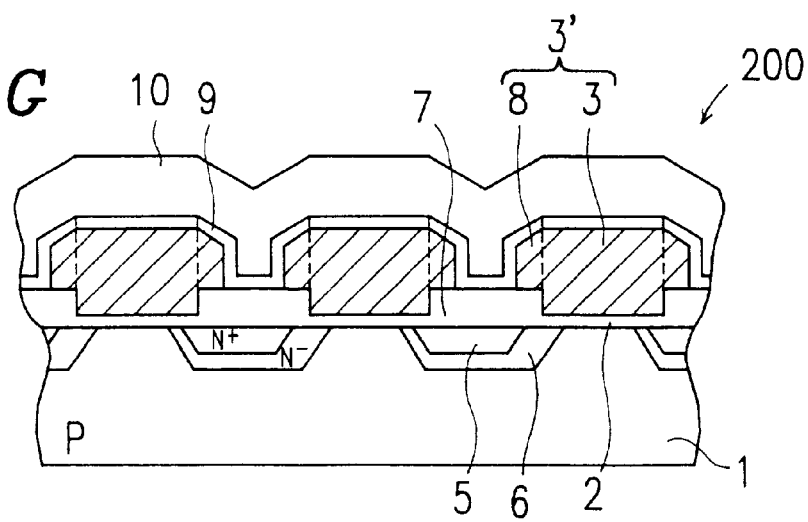

Subsequently, a fourth polysilicon film is formed on the ONO film 9. By patterning the fourth polysilicon layer, the ONO film 9, and the first and second polysilicon films 3 and 8 by photolithography, the control gates 10, the insulating films 9, and the floating gates 3' are formed (FIG. 8G). The control gates 10 of respective memory cells are formed consecutively in the X direction, forming one word line.

Alternatively, the control gates 10 (i.e., the word line WL) may be of a double-layered structure including the fourth polysilicon film and a metal silicide film with a high melting point such as tungsten silicide (WSi).

Thereafter, boron ions are implanted in the semiconductor substrate 1 under the conditions of an acceleration energy of 40 KeV and a dose amount of $1 \times 10^{13}/cm^2$ using the word lines as a mask, so as to form p-type impurity diffusion layers 11 as isolators (see FIG. 5C).

In this example, the isolation is performed by junction isolation. The present invention is also applicable to the case where the isolation is performed by forming thick insulating films such as LOCOS films. For example, as shown in a memory cell array 200' of FIG. 9, LOCOS films 13 are formed on the semiconductor substrate 1 before the formation of the tunnel insulating film 2 and the first polysilicon films 3.

In this example, the floating gates 3' composed of the first polysilicon films 3 and the second polysilicon films 8 are continuously formed in a shape of stripes. Alternatively, they may be formed separately from one another, and the fourth polysilicon film may be patterned so that the resultant word lines completely cover the floating gates.

Figure 9:
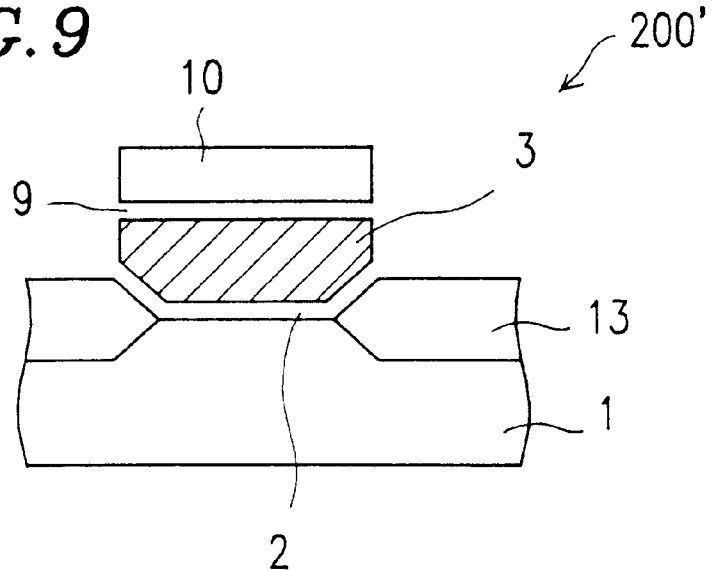
FIG. 9 is a sectional view of a nonvolatile semiconductor memory using LOCOS films as isolators according to the present invention.

In the case of using the LOCOS films 13 as isolators as shown in FIG. 9, the overlap of the floating gate with the LOCOS film 13 can be minimized because the overlap is required only for an aligning allowance at photolithography.

EXAMPLE 2

Figure 10:
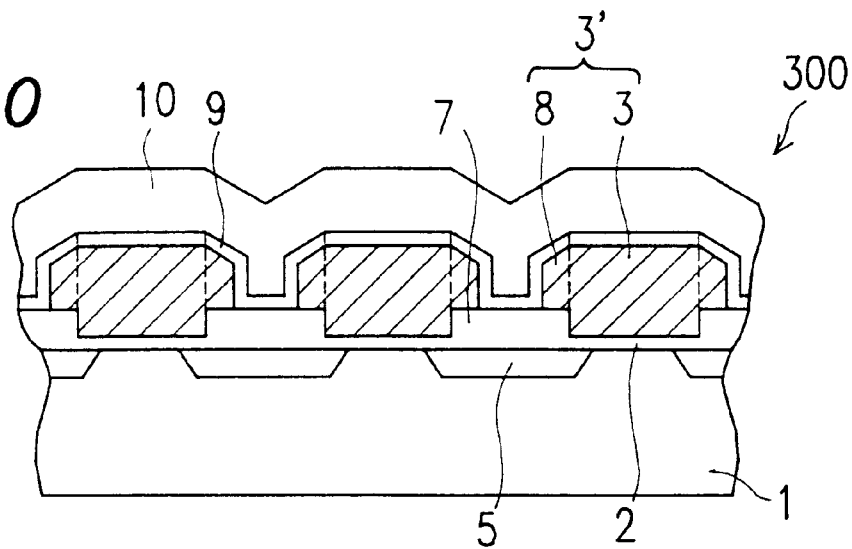
FIG. 10 is a sectional view of a nonvolatile semiconductor memory of Example 2 according to the present invention.

FIG. 10 is a sectional view of a memory cell array 300 of the nonvolatile semiconductor memory of Example 2 according to the present invention. In FIG. 10, the same components are denoted by the same reference numerals as those in FIGS. 5A to 5C.

Referring to FIG. 10, the memory cell array 300 of this example is the same as the memory cell array 200 of Example 1, except that the low-density impurity diffusion layers 6 are not formed in this example.

FIG. 11 shows the conditions of each operation mode when the nonvolatile semiconductor memory of this example is used. The conditions are shown with reference to the circuit diagram of FIG. 6, as in Example 1.

Referring to FIGS. 6 and 11, when the memory cell $C_{12}$ is selected, in the write operation, a high voltage $VH_1$ (8 V, for example) is applied to the word line $WL_1$ connected to the selected cell $C_{12}$. A predetermined power voltage $V_{cc}$ (4 V, for example) is applied to the bit line $BL_2$, one of the two bit lines connected to the selected cell $CL_2$, while 0 V is applied to the other bit line $BL_3$. As a result, hot electrons generated in the channel region flow in the floating gate. As for the non-selected cells, voltages are applied to two bit lines which are connected to each non-selected cell so that the two bit lines have the same voltage.

In the erase operation, a negative voltage $-VH_2(-12$ V, for example) is applied to the word line $WL_1$, while a predetermined positive voltage $V_{cc}$ (4 V, for example) is applied to all or part of the bit lines, allowing a Fowler-Nordheim (FN) tunnel current to flow. Thus, data in a plurality of memory cells (all memory cells in a block) can be erased at one time.

In the read operation, a voltage $V_{cc}$ is applied to the word line $WL_1$ to which the selected cell $C_{12}$ is connected, while a predetermined voltage $V_L$ (for example, 1 V) is applied to the bit line $BL_2$ and 0 V to the bit line $BL_3$, so as to detect a current flowing between the bit lines $BL_2$ and $BL_3$. As for the bit lines $BL_1$ and $BL_4$ which are connected to the non-selected cells, voltages are applied to the bit lines $BL_1$ and $BL_4$ so that they have the same voltages as the bit lines $BL_2$ and $BL_3$, respectively. The voltages in the table of FIG. 11 have the relationship of $VH_1$, $VH_2 > V_{cc} > V_L$.

Next, the fabrication process of the nonvolatile semiconductor memory of this example will be described with reference to FIGS. 12A to 12E.

First, the tunnel oxide film 2 with a thickness of about 8 nm is formed on the semiconductor substrate 1 by thermal oxidation. Then, first polysilicon is deposited on the entire surface of the resultant substrate to a thickness of about 100 to 200 nm. The resultant first polysilicon layer is patterned by photolithography using a photoresist 4 to form the first polysilicon films 3 which are to constitute the floating gates in the shape of stripes extending in the channel width direction.

Figure 12A:
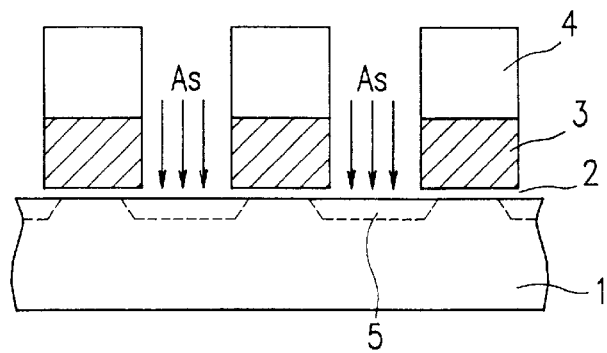
FIGS. 12A to 12E are sectional views illustrating the steps of the fabrication process of the nonvolatile semiconductor memory of Example 2.
Figure 12B:
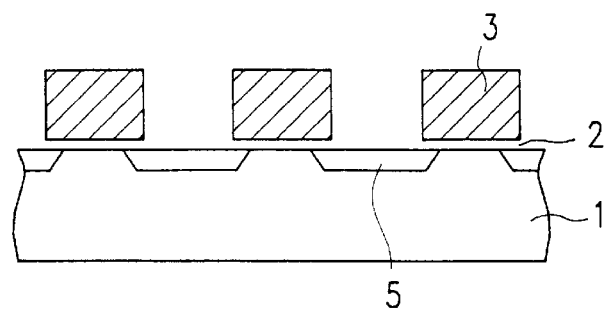

Thereafter, arsenic ions are implanted in the semiconductor substrate 1 under the conditions of an acceleration energy of 70 KeV and a dose amount of $1 \times 10^{15}/cm^2$ using the pattern of the photoresist 4 and the first polysilicon films 3 as a mask, so as to form the high-density impurity diffusion layers 5 which are to be the bit lines (FIG. 12A). Thereafter, after removing the photoresist 4, the resultant substrate is heat-treated in a nitrogen atmosphere at 900° C. for 10 minutes, so as to form the diffusion layers (FIG. 12B).

Figure 12C:
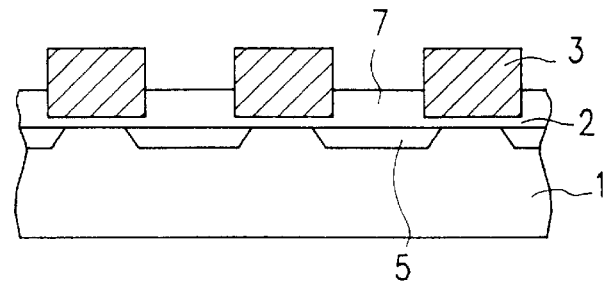

An insulating material is then deposited by CVD to cover the first polysilicon films 3 and etched back, so that insulating films 7 with a thickness 5 to 10 times larger than that of the tunnel insulating film 2 are formed between the first polysilicon films 3 (FIG. 12C).

Figure 12D:
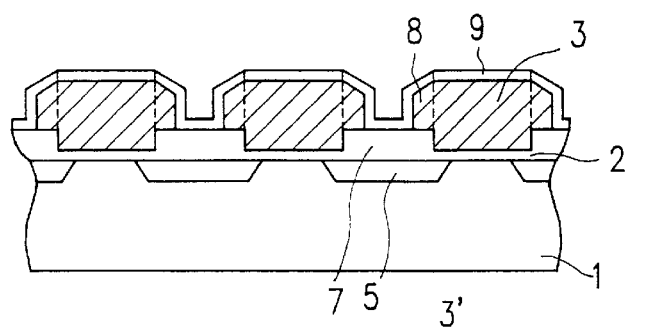

Then, second polysilicon is deposited on the entire surface of the resultant substrate and etched back, so as to form second polysilicon films 8 on the sides of the first polysilicon films 3 in such a manner that they are electrically connected with each other. Thereafter, the ONO film 9 is formed on the resultant substrate (FIG. 12D).

Figure 12E:
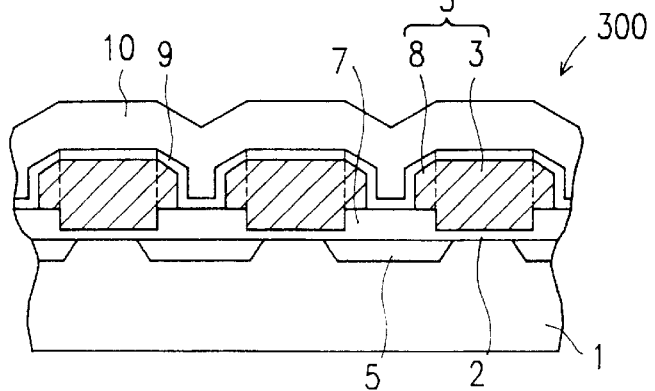

Thereafter, a fourth polysilicon film is formed on the ONO film 9. By patterning the fourth polysilicon layer, the ONO film 9, and the first and second polysilicon films 3 and 8 by photolithography, the control gates 10, the insulating films 9, and the floating gates 3' are formed (FIG. 12E). The control gates 10 of respective memory cells are formed consecutively in the X direction, forming one word line.

Alternatively, the control gates 10 (i.e., the word line WL) may be of a double-layered structure including the fourth polysilicon film and a metal silicide film with a high melting point such as tungsten silicide (WSi).

Thereafter, boron ions are implanted in the semiconductor substrate 1 under the conditions of an acceleration energy of 40 KeV and a dose amount of $1 \times 10^{13}/cm^2$ using the word lines as a mask, so as to form p-type impurity diffusion layers 11 as isolators.

In this example, as in Example 1, LOCOS films also may be used as isolators.

EXAMPLE 3

Figure 13:
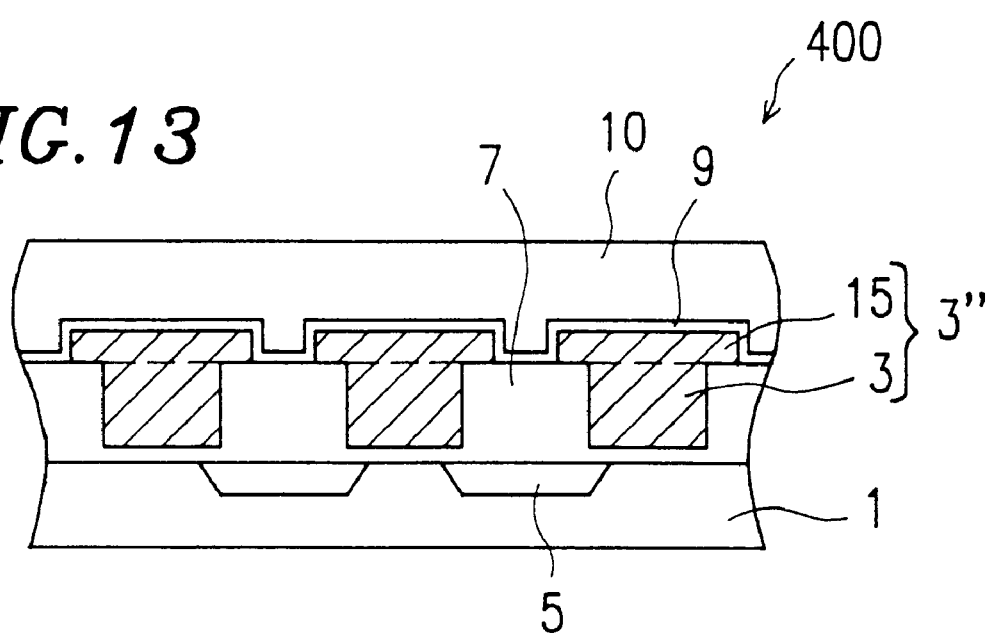
FIG. 13 is a sectional view of a nonvolatile semiconductor memory of Example 3 according to the present invention.

FIG. 13 is a sectional view of a memory cell array 400 of the nonvolatile semiconductor memory of Example 3 according to the present invention. In FIG. 13, the same components are denoted by the same reference numerals as those in FIGS. 5A to 5C.

Referring to FIGS. 14A to 14E, the fabrication process of the nonvolatile semiconductor memory of this example will be described.

Figure 14A:
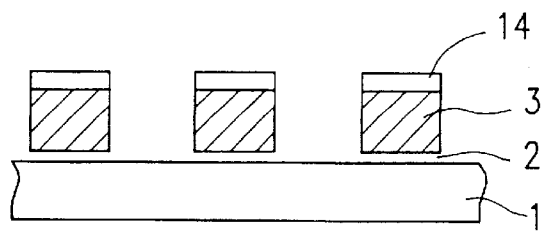
FIGS. 14A to 14E are sectional views illustrating the steps of the fabrication process of the nonvolatile semiconductor memory of Example 3.

First, the tunnel oxide film 2 with a thickness of about 8 nm is formed on the semiconductor substrate 1 by thermal oxidation. Then, first polysilicon is deposited on the entire surface of the resultant substrate to a thickness of about 100 to 200 nm, and then silicon nitride is deposited on the first polysilicon layer to a thickness of 10 to 20 nm. The resultant first polysilicon layer and the nitride layer are patterned by photolithography using a photoresist to form first polysilicon films 3 which are to constitute the floating gates covering the channel regions and nitride films 14 in a shape of stripes extending in the channel width direction (FIG. 14A).

Figure 14B:
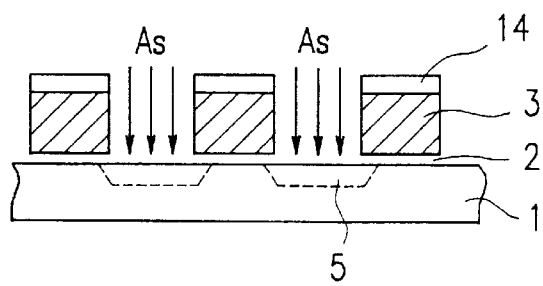

Thereafter, arsenic ions are implanted in the semiconductor substrate 1 under the conditions of an acceleration energy of 20 to 60 KeV and a dose amount of $1 \times 10^{15}$ to $5 \times 10^{15}/cm^2$ using the pattern of the first polysilicon films 3 and the silicon nitride films 14 as a mask, so as to form high-density impurity diffusion layers 5 which are to be the bit lines (FIG. 14B).

Figure 14C:
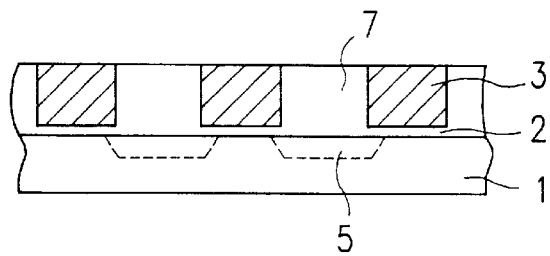

Thereafter, an insulating material such as silicon oxide is deposited by CVD to cover the first polysilicon films 3, and the resultant insulating layer is etched by chemical mechanical polishing (CMP) until the top surfaces of the first polysilicon films 3 are exposed, and then planarized. As a result, the spaces between the first polysilicon films 3 located above the diffusion layers 5 to be formed later are filled with insulating films 7 (FIG. 14C). The silicon nitride films 14 serve as a stopper for the CMP process.

Figure 14D:
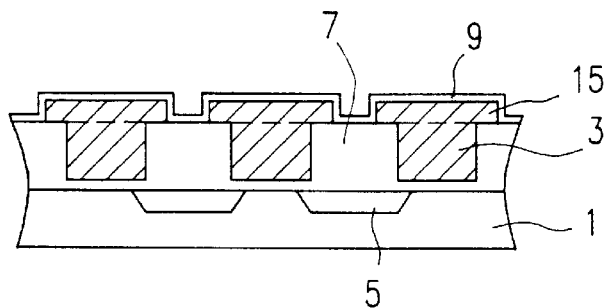

Then, third polysilicon is deposited on the entire surface of the resultant substrate and patterned, so as to form third polysilicon films 15 of which surface area is larger than that of the first polysilicon films 3. The first polysilicon films 3 and the third polysilicon films 15 constitute the floating gates 3". Thereafter, the ONO film 9 is formed on the resultant substrate (FIG. 14D).

Figure 14E:
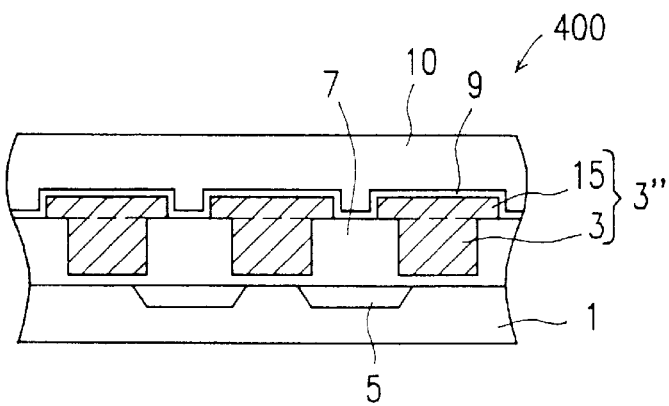

Subsequently, a conductive layer which is to be the control gates 10, for example, a fourth polysilicon film or a double-layer film of the fourth polysilicon film and a tungsten silicide film, are formed on the entire surface of the resultant substrate. The conductive layer, the ONO film 9, the third polysilicon films 15, and the first polysilicon films 3 are etched using a resist mask, so as to form the word lines and the floating gates (FIG. 14E).

Thereafter, boron ions are implanted in the semiconductor substrate 1 under the conditions of an acceleration energy of 20 to 40 KeV and a dose amount of $1 \times 10^{13}/cm^2$ to $3 \times 10^{13}/cm^2$ using the word lines as a mask, so as to form p-type impurity diffusion layers 11 as isolators, as shown in FIG. 5C.

In this example, as in Examples 1 and 2, LOCOS films may be used as isolators.

Thus, according to the present invention, the coupling ratio can be increased without increasing the size of memory cells. This makes it possible to lower the voltage to be applied to the floating gates, and thus reduce power consumption.

The second polysilicon films are formed on the sides of the first polysilicon films having the minimum width in the spaces between the first polysilicon films in the channel length direction of the floating gates. Accordingly, no overlap of the floating gates with the isolation regions is required in the channel width direction of the floating gates. Thus, the cell area does not increase.

The insulating films are formed between the first polysilicon films by CVD. This prevents a variation in the size of the first polysilicon films which tends to occur when the insulating films are formed by oxidation.

In Example 3, the surface is planarized before the formation of the control gates. This facilitates obtaining a planar device surface. Accordingly, with only the thickness of the third polysilicon films existing under the word lines, the resultant word lines are substantially planar, and thus an increase in line resistance can be prevented.

According to the present invention, the device can be further miniaturized. Since the elements are isolated by the diffusion layers, the coupling capacitance between the floating gate and the control gate can be made larger than the coupling capacitance between the floating gate and the semiconductor substrate without overlapping the floating gate with the isolation region. This makes it possible to increase the coupling ratio as in the case where the LOCOS films are used as isolators. The height of the step under the word lines can be reduced compared with the conventional case where the LOCOS films are formed to increase the coupling ratio. This prevents the coverage of the word lines from deteriorating due to the step, and thus the resistance of the word lines is prevented from increasing due to deteriorated coverage.

According to the present invention, the $N^+$ diffusion bit lines can be formed in a self-aligned manner without increasing the cell array area.

In these examples, a P-type semiconductor substrate and N-type diffusion layers are utilized, however, the present invention is not limited to these types of the semiconductor substrate and the diffusion layers.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nonvolatile semiconductor memory including a memory cell array having memory cells arranged in a matrix, the memory cell array comprising:

a semiconductor substrate;

a tunnel oxide film formed on the semiconductor substrate;

floating gates including first polysilicon films formed on the tunnel oxide film and second polysilicon films formed on both sides of the respective first polysilicon films;

drain and source diffusion regions embedded in the substrate, where each of the drain and source diffusion regions underlie the second polysilicon films and an edge of the first polysilicon films for each floating gate;

first insulating films formed on the floating gates; and control gates formed over the first insulating films and above the first and second polysilicon films of the floating gates, wherein the memory cell array further comprising second insulating films formed on the tunnel oxide film between the first polysilicon films, the second insulating films having a predetermined thickness which is uniformly thinner than a minimum thickness of the first polysilicon films, and wherein the second polysilicon films are formed on the second insulating films, and further wherein the second insulating films are formed above the drain and source diffusion regions, and the second polysilicon films are uniformly spaced from the drain and source diffusion regions by a combined thickness of the second insulating films and the tunnel oxide film which combined thickness is substantially greater than the thickness of the tunnel oxide film that separates the edges of the first polysilicon films and the drain and source diffusion regions.

2. A nonvolatile semiconductor memory according to claim 1, wherein the second insulating films also separate the second polysilicon films of adjacent memory cells, and the second polysilicon films prevent capacitive coupling between the separated second polysilicon films of the floating gates and the semiconductor substrate.

3. A nonvolatile semiconductor memory including a memory cell array having memory cells arranged in a matrix, the memory cell comprising:

a semiconductor substrate;

a tunnel oxide film formed on the semiconductor substrate;

a floating gate including a first polysilicon film formed on the tunnel oxide film and a second polysilicon film formed on both sides of the first polysilicon film;

drain or source diffusion regions embedded in the substrate, where one of the drain or source diffusion regions underlie at least a portion of the second polysilicon film extending beyond the first polysilicon film for each floating gate;

a first insulating film formed on the floating gate; and a control gate formed over the first insulating film and above the first and second polysilicon films of the floating gate, wherein the memory cell further includes a second insulating film formed on the tunnel oxide film and adjacent the first polysilicon film, the second insulating film and second polysilicon film have a combined thickness which is substantially the same as the thickness of the first polysilicon films, whereby a planarized upper surface of the floating gate facing the control gate includes surfaces of the first polysilicon film and surfaces of the second polysilicon film, and wherein the second polysilicon film covers the first polysilicon film and portions of the second insulating film, whereby the second polysilicon film is uniformly separated from the drain and source regions of the substrate by the tunnel oxide film and the second insulating film, and the first polysilicon film is separated from the substrate by only the tunnel oxide film.

4. A nonvolatile semiconductor memory according to claim 3, wherein the second insulating film separates a second polysilicon film of an adjacent memory cell, and the second insulating film prevents capacitive coupling between the corresponding second polysilicon film of the floating gate and the substrate.

5. A nonvolatile semiconductor memory including a memory cell array having memory cells arranged in a matrix, the memory cell comprising:

a semiconductor substrate;

a lower insulating film on the semiconductor substrate;

a floating gate formed on the lower insulating film and over the semiconductor substrate to form a first capacitance between the floating gate and the semiconductor substrate, and the floating gate has a center polysilicon film on the lower insulating film and a side polysilicon film that abuts both sides of the center polysilicon film;

an upper insulating film on both the center and side polysilicon films of the floating gate;

a control gate formed over the floating gate with the upper insulating film interposed therebetween, the control gate forming a second capacitance with the floating gate;

wherein the second capacitance is larger than the first capacitance.

6. A nonvolatile semiconductor memory according to claim 5, wherein the floating gate has a bottom surface which is a bottom surface of the center polysilicon film and which contributes to forming the first capacitance with the semiconductor substrate, and an upper surface which is a combined area of upper surfaces of the center and side polysilicon films which contribute to forming the second capacitance with the control gate, wherein an area of the upper surface is larger than an area of the lower surface.

7. A nonvolatile semiconductor memory according to claim 6, further comprising a source region and a drain region formed in a surface region of the semiconductor substrate, wherein the bottom surface of the center polysilicon film covers at least a part of the source region and at least a part of the drain region.

8. A nonvolatile semiconductor memory according to claim 5, wherein the floating gate in a cross section along a channel direction of the memory cell has a width of the upper surface along the channel direction that is larger than a width of the bottom surface along the channel direction.

9. A nonvolatile semiconductor memory according to claim 8, wherein the cross section of the floating gate has a "T" shape, the first portion includes a "leg" portion of the "T" shape which is formed by the center polysilicon film, and the second portion includes a "wing" portion of the "T" which is formed by the side polysilicon film and the center polysilicon film.

10. A nonvolatile semiconductor memory according to claim 5, wherein the lower insulating film is a tunnel oxide film.

* * * * *